United States Patent [19]

Taylor

[11] Patent Number: 4,619,863

[45] Date of Patent: Oct. 28, 1986

[54] SOLAR CELL ASSEMBLY

[75] Inventor: Hylton Taylor, Galltfaenan Hall, Wales

[73] Assignee: Pilkington P.E. Limited, United Kingdom

[21] Appl. No.: 573,487

[22] Filed: Jan. 24, 1984

[30] Foreign Application Priority Data

Feb. 1, 1983 [GB] United Kingdom ................. 8302772

[51] Int. Cl.[4] ......................... H01L 31/00; B05D 5/12

[52] U.S. Cl. .................................... 428/221; 136/256; 427/74; 427/162

[58] Field of Search .................... 428/67, 76, 142, 173, 428/221; 427/162, 74; 350/169; 156/94; 136/256

[56] References Cited

U.S. PATENT DOCUMENTS

| | | | |
|---|---|---|---|
| 2,034,308 | 5/1933 | Morgan | 428/173 |
| 4,070,105 | 1/1978 | Marzouk | 351/159 |
| 4,133,699 | 1/1979 | Menlenberg | 136/256 |
| 4,153,654 | 5/1979 | Maffit et al. | 264/1 |
| 4,268,347 | 5/1981 | Stephens | 156/628 |
| 4,414,317 | 11/1983 | Culp et al. | 430/4 |
| 4,419,305 | 12/1983 | Matles | 156/94 |
| 4,425,171 | 1/1984 | Oosaka et al. | 156/64 |

FOREIGN PATENT DOCUMENTS

| | | |
|---|---|---|
| 402825 | 12/1933 | United Kingdom . |
| 688390 | 3/1953 | United Kingdom . |
| 1441381 | 6/1976 | United Kingdom . |
| 2016193A | 2/1978 | United Kingdom . |
| 1522887 | 8/1978 | United Kingdom . |
| 2046977A | 3/1980 | United Kingdom . |

OTHER PUBLICATIONS

Van Nostrand's Scientific Encyclopedia 5th Edit. Considine, Ed. (1976) pp. 1902–1903.

Horne, "Spectacle Lens Technology" Crane Russak & Co. Inc., New York 1978.

Magee et al. "Design and Practical Aspects . . . " Conf. Record 9th IEEE Photospecialists Conf. May 1972, p. 6.

Andrianov et al. "Stabilization of the Characteristics of Cds Film Photoconverters" Solar Energy 11(1–2) 61–64 (1975).

*Primary Examiner*—George F. Lesmes

*Assistant Examiner*—William M. Atkinson

*Attorney, Agent, or Firm*—F. Eugene Davis, IV; Mark P. Stone

[57] ABSTRACT

To facilitate correct orientation of a solar cell cover to locate its coated face away from the solar cell member with which it is assembled, its other face is provided with an orientation indicative surface relief mark which becomes invisible when the cover is secured to the member by an adhesive of matching refractive index.

5 Claims, 3 Drawing Figures

SOLAR CELL ASSEMBLY

This invention concerns improvements in or relating to transparent articles, and to their assembly with other members.

The invention relates more particularly to thin transparent articles having one major face which is differentiated from the opposite major face and which need to be secured to a member with said one major face remote from the member. A particular example of such thin transparent article is a solar cell cover (sometimes called a cover glass). Such covers have a coating, normally an anti-reflection and/or anti-static coating, on one major face and are required to be secured to a solar cell member with the other major face adjacent the solar cell member, i.e. with the coated face facing outwardly. The thinness of the solar cell cover glass is such that there can be problems in readily ascertaining which face is in fact the coated face, and therefore in correctly orienting the cover for adhesion to the solar cell with the coated face remote from the cell. It has previously been proposed to overcome this problem by cropping a particular corner of the cover glass so that it can be correctly oriented by ensuring that the cropped corner is at the correct location (e.g. top right). The cropping may be asymmetric, e.g. a 30°, 60°, 90° triangle may be removed, so that correct orientation of the triangle is also used, particularly with a square cover. This cropping procedure has the disadvantage that a small portion of the cover glass, and therefore of its coating, is removed which detracts from its protective function. Additionally, cover glasses can become accidentally chipped, particularly at the corners, during handling, which can lead to confusion as to which is the intentionally cropped corner. It has also been proposed to apply a dyeline along an edge or part of an edge of a cover glass so that the cover glass can be correctly oriented by correct location of the dyeline. It has been found, however, that the dyeline is so thin that at least sometimes it is not properly seen.

It will be appreciated that for the cover glass to serve fully its protective function, the coating should not be marred and the cover should retain its full size. Additionally it should retain its transparency so as to avoid undesired scattering or reflection of radiation which is required for energisation of the solar cell.

The present invention provides an assembly comprising a transparent article having a surface relief mark on one face of the article, and a member to which the article is secured by an adhesive applied between said one face of the article and said member, the adhesive having a refractive index which substantially matches that of the article whereby in the assembly the mark is substantially invisible.

According to the present invention there is also provided a thin transparent article having one major face differentiated, e.g. by having a coating thereon, from the opposite major face and which is required to be secured to a member with said one major face of the article remote from said member, the article having on its said opposite major face an orientation indicative surface relief mark. The nature of a surface relief mark is such that the mark becomes substantially invisible when a substantially index matching medium is applied over it. Thus, while such an article is detached from the member, the mark is visible and can be used correctly to orientate the article so that said one major face is facing in a known direction, and is thereby effectively identified. The article can then be secured to said member by the application of an index matching adhesive (i.e. an adhesive whose refractive index substantially matches that of the article) between said opposite major face and said member. The application of such adhesive will cause the mark substantially to disappear from sight and therefore in the assembly comprising the article and the member the mark will be substantially invisible. The transparency of the article will therefore be maintained. Additionally, if in error the adhesive should be applied to the wrong face of the article, i.e. to said one major face, so that the article is or is about to be adhered to said member the wrong way round, then the mark will remain visible and the error is readily apparent.

By the term "thin transparent article" is meant an article of substantial transparency whose thickness is so small that there can be difficulty in visibly distinguishing between the respective major faces when simply viewing the article with the unaided normal human eyes, for example in identifying which of the major faces has a coating. The thickness may be less than about 2 mm or perhaps less than 1 mm. The invention particularly provides as said article a solar cell cover which may have a thickness in the range of about 500 microns (i.e. 0.5 mm) to 50 microns (0.05 mm). The article may be of relatively small size generally, e.g. may have a major dimension less than about 100 mm, or perhaps less than 50 mm. Typically a solar cell cover may have a length in the range of about 20 mm to 70 mm and a width in the range of about 10 mm to 30 mm. Particular sizes by way of example are 20 mm$\times$10 mm, 20 mm$\times$20 mm, 40 mm$\times$20 mm, and 62 mm$\times$25 mm.

The invention yet further provides an assembly comprising a thin transparent article having one major face differentiated, e.g. by having a coating thereon, from the opposite major face and having an orientation indicative surface relief mark on said opposite major face of the article which opposite major face is secured to a member by an adhesive having a refractive index which substantially matches that of the article whereby in the assembly the mark is substantially invisible. The invention particularly provides such an assembly in which said member comprises a solar cell and said article is a solar cell cover.

The invention still further provides a method of assembling a transparent article, such as a solar cell cover, with a member, such as a solar cell member, comprising the steps of orienting the article by viewing an orientation indicative surface relief mark on that face of the article which is to be adjacent the member in the finished assembly, and securing the article to the member by applying between the member and said face of the article an adhesive whose refractive index substantially matches that of the article. Preferably the adhesive is first applied to said face of the article and the article with the adhesive on it is then placed against the member. The method preferably includes the further step of viewing the article after application of the adhesive to check that said mark is no longer visible.

The orientation indicativeness of the mark can be by way of its location on the face and/or by way of its form. Thus, with a rectangular faced article the mark can be orientationally indicative by being located, for example, near or towards a corner of the article, and the form of the mark need not necessarily of itself be orientationally indicative. However, with a square faced article, then the mark itself can be of a form which is orientationally indicative, for example may take the form of an arrow or other symbol, or one or more letters or words.

The surface relief mark is preferably recessed or indented in the surface and may be applied, for example, by etching, sandblasting, or the like. However, the mark could alternatively stand out from the surface, e.g. be embossed or comprise a projection attached to the surface.

In order that the invention may be better understood a particular embodiment thereof will now be described, by way of example, with reference to the accompanying drawings in which.

Figure 1:
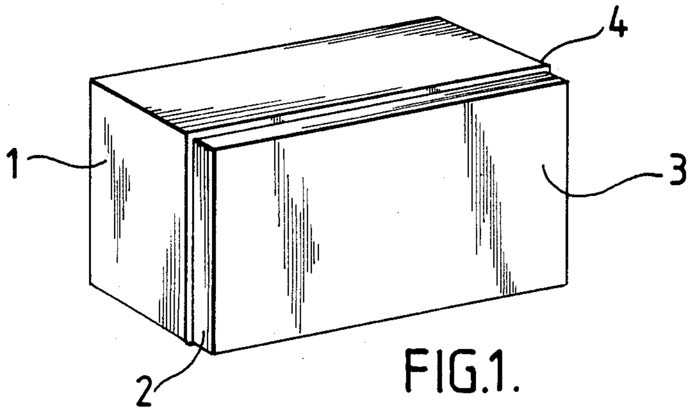
FIG. 1 is a schematic representation of a solar cell assembly.

FIG. 1 illustrates a solar cell assembly comprising a solar cell member shown as a block 1 to the front of which is secured a cover glass 2. The cover glass 2 is transparent to solar radiation which is transmitted through it on to the solar cell in the block 1 in known manner. The cover glass 2 has one major face 3 bearing an anti-reflection and/or anti-static coating, and is secured to the block 1 in an orientation such that the coated face 3 faces outwardly, i.e. is remote from the block 1. Thus the cover glass 2 is secured to the block 1 with its major face opposite the coated face 3 adjacent the block by means of an adhesive layer 4 applied between the block and that opposite face of the cover.

Figure 2:
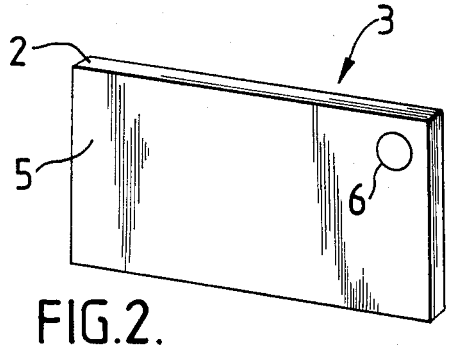
FIG. 2 is a schematic representation of a solar cell cover used in the assembly of FIG. 1.

The cover glass 2 is also shown in FIG. 2 but oriented so that its coated face 3 is remote from the viewer (and therefore not directly visible) and with its opposite major face 5, which is not coated, towards the viewer. In accordance with the invention a mark 6 is provided on this face 5 to enable the cover to be applied to the block 1 in the correct orientation, i.e. with the coated face 3 facing outwardly. The mark 6 is orientation indicative so that an operator can by observation of this mark put the cover glass 2 in the correct orientation. With a rectangular cover as shown in FIGS. 1 and 2 orientation indicativeness can be achieved by location of the mark on the face 5 and in FIG. 2 the mark 6 is shown as a simple circle located towards one corner of the face 5. When the mark 6 is in the upper right hand corner (as shown in FIG. 2) with the longer dimension of the rectangular cover horizontal, then the coated face 3 must be facing away from the observer. It will be seen that if the observer views the transparent cover glass 2 with the coated face 3 towards the observer, then the mark 6 cannot be located at the upper right hand corner with the longer dimension of the rectangle horizontal. The mark therefore enables the operator to orient the cover by viewing the mark so that the coated face 3 faces in a known direction and is therefore effectively identified. The cover 2 can then be secured to the block 1 with the uncoated face 5 adjacent (and the coated face 3 remote from) the block.

The mark 6 is a surface relief mark such that it disappears from sight when an index matching medium is applied to it. For example, the mark may be etched, or sandblasted, so that it is in fact formed by removal of material from the cover glass 2 and is recessed or indented in the face 5. It is normally visible as a mark by reason of light scattered from the recess or indentation. However, when the indentation or recess is filled with an index matching medium, light is not scattered thereby and the mark becomes invisible.

The adhesive 4 used to secure the cover glass 2 to the block 1 is an optical cement which constitutes a medium whose refractive index substantially matches that of the cover glass 2. This index matching between adhesive and cover glass is, in any case, desirable since it prevents unwanted radiation reflections occurring at the adhesive/cover glass interface. With a surface relief mark in accordance with the present invention, the index matching adhesive when applied to the face 5 so as to cover the mark 6 serves to remove the mark from sight. Preferably the adhesive layer is first applied to the face 5 of the cover 2 and the cover with the adhesive on it is then placed against the block 1. With this procedure the operator can view the cover glass after applying the adhesive to check that the mark is no longer visible before the cover is actually attached to the block 1. If the mark is still visible, indicating that the adhesive has in error been applied to the wrong face of the cover glass, then that cover glass can be discarded without having to detach it from the block. The adhesive could alternatively first be applied to the face of the block 1 and the cover glass then placed against that block face. However, this has the disadvantage that if the cover glass is in error applied the wrong way round, i.e. with its coated face 3 adjacent the block, so that the mark remains visible, this is not apparent until after the cover glass has been attached to the block with consequential difficulties of removing the cover glass and possibly having to clean the face of the block before application of another cover glass.

It will be appreciated that, as well as providing a check on correctly oriented application of the cover glass, disappearance of the mark means that it does not detract from transparency in the finished assembly. Thus, when it is against the index matching adhesive in the finished assembly the mark does not scatter the solar radiation transmitted through the cover glass and therefore does not reduce the amount of solar radiation incident on the solar cell.

Figure 3:
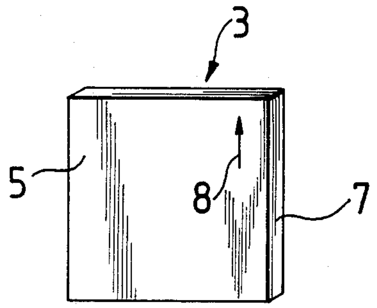
FIG. 3 is a schematic representation of an alternative form of solar cell cover.

It will be seen that with a rectangular cover glass correct orientation can be achieved by use of a simple mark 6 as shown in FIG. 2 whose location on the cover glass face 5 can determine the orientation. With a square cover glass, then the form of the mark should itself be orientationally indicative. FIG. 3 schematically shows a square cover glass 7 having a mark 8 which is, by way of example, shown in the form of an arrow located towards one corner of the cover glass on its non-coated face 5. With the arrow upright and in the top right hand corner, then the orientation of the cover glass must be such that the coated surface is identified as facing away from the viewer. If the coated surface is facing towards the viewer, then the arrow cannot be located in upright disposition at the top right hand corner.

It will be understood that the particular forms of mark shown and described are given purely by way of illustration and example and that other forms may be employed. It will further be appreciated that the mark may occupy as much of the face 5 as is desired since the mark will disappear from view as explained above when that face is secured to the block 1 by the index matching adhesive 4. Thus, as a further example, the mark could take the form of one or more letters or words which can only be read properly when the cover glass is correctly oriented in a manner effective to identify the coated face.

It will further be appreciated that the surface relief mark can be of any type which enables the mark to become invisible when an index matching medium is applied. As described above, the mark is preferably in the nature of recesses or indentations in the cover glass 2, but it could alternatively take the form of a projection standing proud from the face 5, e.g. some form of embossing or some attachment to the face. The mark may be produced on the face 5 of the cover glass 2 before, during or after the coating operation on face 3 but should, of course, be applied in a manner which ensures production of the mark on the correct face. Solar cell cover glasses are usually cut from a larger sheet which is sub-divided to produce the individual cover glasses, and a plurality of marks may be produced on the appropriate face of the larger sheet at positions such that a mark is suitably located on each individual cover glass when the sheet is cut.

It will be understood that the assembly shown in FIG. 1 is purely schematic for illustrative purposes, and that in practice there may be a multiplicity of solar cells with respective cover glasses, e.g. on a satellite.

Yet further, it will be understood that the invention may find application in assemblies other than solar cells and their covers where it is required to secure a transparent article bearing a mark to some other member (which may also be transparent) so that the mark becomes substantially invisible in the completed assembly, which may for example be a laminate, and especially where a thin transparent article with a particular face, which cannot otherwise readily be identified, is to be secured to another member with that face remote from the member.

I claim:

1. An assembly comprising a transparent cover member having a surface reference mark provided by a surface variation on an indicating major face of the cover member, and a solar cell to an adjacent surface of which the cover member is secured by an adhesive applied between said indicating major face of the cover member and the adjacent surface of the solar cell, the adhesive having a refractive index which substantially matches that of the cover member so that the applied adhesive not only secures the cover member to the solar cell but also renders the surface reference mark substantially invisible in the completed assembly, said reference mark being arranged so as to distinguish said indicating major face of the cover member from the other major face thereof and indicates the orientation in which the cover member is to be mounted on the solar cell.

2. An assembly according to claim 1 in which said mark is a recess in said surface.

3. An assembly according to claim 1 in which said mark stands out from said surface.

4. A method of preparing an assembly as claimed in claim 1 comprising the steps of orienting the transparent cover member such that said surface reference mark is adjacent to the solar cell in the finished assembly, and securing the cover member to the solar cell by applying between the solar cell and said indicating major face of the cover member an adhesive whose refractive index substantially matches that of the cover member.

5. A method according to claim 4 in which the adhesive is first applied to said indicating major face of the transparent cover member and the transparent cover member with the adhesive on it is then placed against the solar cell.

* * * * *